(12) United States Patent
Iacoponi et al.

(10) Patent No.: US 6,489,240 B1
(45) Date of Patent: Dec. 3, 2002

(54) METHOD FOR FORMING COPPER INTERCONNECTS

(75) Inventors: John A. Iacoponi, Austin, TX (US); Paul R. Besser, Sunnyvale, CA (US); Frederick N. Hause, Austin, TX (US); Frank Mauersberger, Radebeul (DE); Errol Todd Ryan, Austin, TX (US); William S. Brennan, Austin, TX (US); Peter J. Beckage, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/871,305

(22) Filed: May 31, 2001

(51) Int. Cl.[7] ........................................... H01L 21/4763
(52) U.S. Cl. ........................ 438/687; 438/633; 438/692
(58) Field of Search ........................ 438/687, 691–693, 438/631, 633, 634

(56) References Cited

U.S. PATENT DOCUMENTS

| | | | | |
|---|---|---|---|---|
| 5,770,095 A | * | 6/1998 | Sasaki et al. | 216/103 |
| 6,028,362 A | * | 2/2000 | Omura | 257/751 |
| 6,046,108 A | * | 4/2000 | Liu et al. | 438/626 |
| 6,100,190 A | * | 8/2000 | Kobori | 438/659 |
| 6,114,243 A | * | 9/2000 | Gupta et al. | 438/633 |
| 6,281,127 B1 | * | 8/2001 | Shue | 438/691 |
| 6,287,968 B1 | * | 9/2001 | Yu et al. | 438/643 |
| 6,309,977 B1 | * | 10/2001 | Ting et al. | 438/706 |
| 6,352,921 B1 | * | 3/2002 | Han et al. | 438/624 |

* cited by examiner

Primary Examiner—Chandra Chaudhari
Assistant Examiner—Thanh Nguyen
(74) Attorney, Agent, or Firm—Williams, Morgan & Amerson

(57) ABSTRACT

A method for forming a semiconductor having improved copper interconnects is provided. The method comprises forming a first dielectric layer above a first structure layer. Thereafter, a first opening is formed in the first dielectric layer, and a first copper layer is formed above the first dielectric layer and in the first opening. A portion of the first copper layer outside of the opening is removed. A surface portion of the first copper layer is also removed from within the opening, and a second layer of copper is formed above the first layer of copper, replacing the removed surface portion.

14 Claims, 13 Drawing Sheets

METHOD FOR FORMING COPPER INTERCONNECTS

BACKGROUND OF THE INVENTION

1. Field of the Invention

This invention relates generally to semiconductor fabrication technology, and, more particularly, to techniques for controlling the formation of copper interconnects.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to contacts to active areas, such as $N^+(P^+)$ source/drain regions and a doped-polycrystalline silicon (doped-polysilicon or doped-poly) gate conductor, and the like. As the size and cross-sectional dimensions of electrical interconnects get smaller, resistance increases and electromigration increases. Increased resistance and electromigration are undesirable for a number of reasons. For example, increased resistance may reduce device drive current, and source/drain current through the device, and may also adversely affect the overall speed and operation of the transistor. Additionally, electromigration effects in aluminum (Al) interconnects, where electrical currents actually carry aluminum (Al) atoms along with the current, causing them to electromigrate, may lead to degradation of the aluminum (Al) interconnects, further increased resistance, and even disconnection and/or delamination of the aluminum (Al) interconnects.

The ideal interconnect conductor for semiconductor circuitry will be inexpensive, easily patterned, have low resistivity, and high resistance to corrosion, electromigration, and stress migration. Aluminum (Al) is most often used for interconnects in contemporary semiconductor fabrication processes primarily because aluminum (Al) is inexpensive and easier to etch than, for example, copper (Cu). However, because aluminum (Al) has poor electromigration characteristics and high susceptibility to stress migration, it is typical to alloy aluminum (Al) with other metals.

As discussed above, as semiconductor device geometries shrink and clock speeds increase, it becomes increasingly desirable to reduce the resistance of the circuit metallization. The one criterion that is most seriously compromised by the use of aluminum (Al) for interconnects is that of conductivity. This is because the three metals with lower resistivities (aluminum, Al, has a resistivity of $2.824 \times 10^{-6}$ ohms-cm at 20° C.), namely, silver (Ag) with a resistivity of $1.59 \times 10^{-6}$ ohms-cm (at 20° C.), copper (Cu) with a resistivity of $1.73 \times 10^{-6}$ ohms-cm (at 20° C.), and gold (Au) with a resistivity of $2.44 \times 10^{-6}$ ohms-cm (at 20° C.), fall short in other significant criteria. Silver (Ag), for example, is relatively expensive and corrodes easily, and gold (Au) is very costly and difficult to etch. Copper (Cu), with a resistivity nearly on par with silver (Ag), a relatively high immunity to electromigration, high ductility and high melting point (1083° C. for copper, Cu, vs. 660° C. for aluminum, Al), fills it) most criteria admirably. However, copper (Cu) is difficult to etch in a semiconductor environment. As a result of the difficulty in etching copper (Cu), an alternative approach to forming vias and metal lines must be used. The damascene approach, consisting of etching openings such as trenches in the dielectric for lines and vias and creating in-laid metal patterns, is the leading contender for fabrication of sub-0.25 micron (sub-0.25$\mu$) design rule copper-metallized (Cu-metallized) circuits.

In the damascene approach, a layer or film of copper is formed over the surface of the dielectric, filling the openings and/or trenches. The excess copper is then removed by polishing, grinding, and/or etching, such as by chemical/mechanical polishing, to leave only the copper in the openings or trenches, which form the copper interconnects. The surface of the copper interconnects, however, may remain rough or scratched by the removal process. This roughening of the surface of the copper interconnect may increase its resistance to the flow of current, reducing its effectiveness as a high-speed, low-resistance conductor.

Additionally, the surface of the copper interconnects may become contaminated by material removed from other portions of the wafer and/or elements found in the CMP slurry. These contaminants may likewise increase the resistance of the copper interconnect, reducing its effectiveness as a high-speed, low-resistance conductor. The contaminants may also have other undesirable effects on the copper interconnect and/or material deposited thereover, such as corrosion, surface flakes that can bridge Cu lines, surface defects and flakes that can result in future delamination of dielectric layers, surface defects that can increase resistance at an interface between a metal line and a metal via, or the like.

The present invention is directed to overcoming, or at least reducing the effects of, one or more of the problems set forth above.

SUMMARY OF THE INVENTION

In one aspect of the present invention, a method is provided. The method comprises forming a first dielectric layer above a first structure layer. Thereafter, a first opening is formed in the first dielectric layer, and a first copper layer is formed above the first dielectric layer and in the first opening. A portion of the first copper layer outside of the opening is removed. A surface portion of the first copper layer is also removed from within the opening, and a second layer of copper is formed above the first layer of copper, replacing the removed surface portion.

In another aspect of the present invention, a semiconductor device is provided. The semiconductor device is comprised of a first dielectric layer positioned above a first structure layer and having a first opening formed therein. A copper interconnect is deposited in the first opening. The copper interconnect has a first and second region wherein the second region forms an upper surface above the first region of the copper interconnect. The second region is formed by a selective deposition process.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
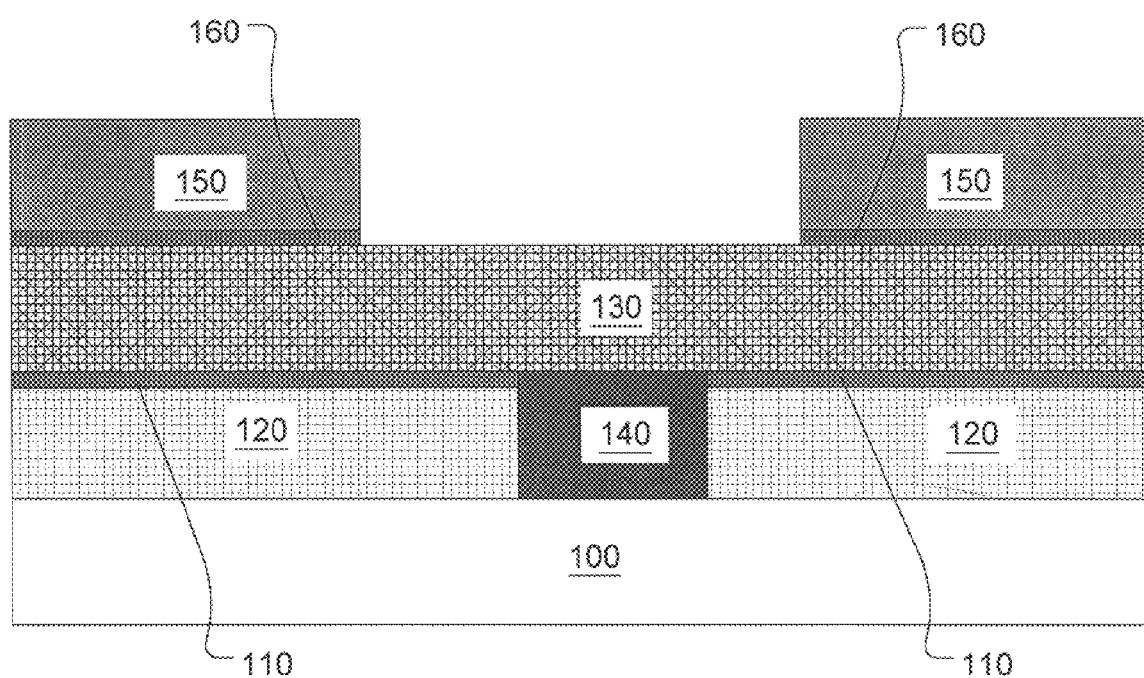
FIGS. 1–7, 10, and 11 schematically illustrate a single-damascene copper interconnect process flow according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–13. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of copper interconnects in a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, a first dielectric layer 120 and a first conductive structure 140 (such as a copper intermetal via connection) may be formed above a structure layer 100 such as a semiconducting substrate. However, the present invention is not limited to the formation of a copper (Cu)-based interconnect above the surface of a semiconducting substrate such as a silicon wafer, for example. Rather, as will be apparent to one skilled in the art upon a complete reading of the present disclosure, a copper (Cu)-based interconnect formed in accordance with the present invention may be formed above previously formed semiconductor devices and/or process layer, e.g., transistors, or other similar structure. In effect, the present invention may be used to form process layers on top of previously formed process layers. The structure layer 100 may be an underlayer of semiconducting material, such as a silicon substrate or wafer, or, alternatively, may be an underlayer of semiconductor devices, such as a layer of metal oxide semiconductor field effect transistors (MOSFETs), and the like, and/or a metal interconnection layer or layers (see FIG. 9, for example) and/or an interlevel (or interlayer) dielectric (ILD) layer or layers, and the like.

In a single-damascene copper process flow, according to various embodiments of the present invention, as shown in FIGS. 1–7, 10 and 11, the first dielectric layer 120 is formed above the structure layer 100, adjacent the first conductive structure 140. As shown in FIG. 1, the first dielectric layer 120 has an etch stop layer (ESL) 110 (typically silicon nitride, $Si_3N_4$, or SiN, for short) formed and patterned thereon, between the first dielectric layer 120 and a second dielectric layer 130 and adjacent the first conductive structure 140. The second dielectric layer 130 is formed above the etch stop layer (ESL) 110 and above the first conductive structure 140. The first dielectric layer 120 has the first conductive structure 140 disposed therein. If necessary, the second dielectric layer 130 may have been planarized using a chemical-mechanical polishing (CMP) process. The second dielectric layer 130 has an etch stop layer 160 (typically also SiN) formed and patterned thereon, between the second dielectric layer 130 and a patterned photomask 150. The patterned photomask 150 is formed and patterned above the etch stop layer 160.

The first and second dielectric layers 120 and 130 may be formed from a variety of dielectric materials, including, but not limited to, materials having a relatively low dielectric constant (low K materials, where K is less than or equal to about 4), although the dielectric materials need not have low dielectric constants. The first and second dielectric layers 120 and 130 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and each may have a thickness ranging from approximately 3000 Å–8000 Å, for example.

The first and second dielectric layers 120 and 130 may be formed from a variety of low K dielectric materials, where K is less than or equal to about 4. Examples include Applied Material's Black Diamond®, Novellus' Coral®, Allied Signal's Nanoglass®, JSR's LKD5104, and the like. In one illustrative embodiment, the first and second dielectric layers 120 and 130 are each comprised of Applied Material's Black Diamond®, each having a thickness of approximately 5000 Å, each being formed by being blanket-deposited by an LPCVD process for higher throughput.

Figure 2:
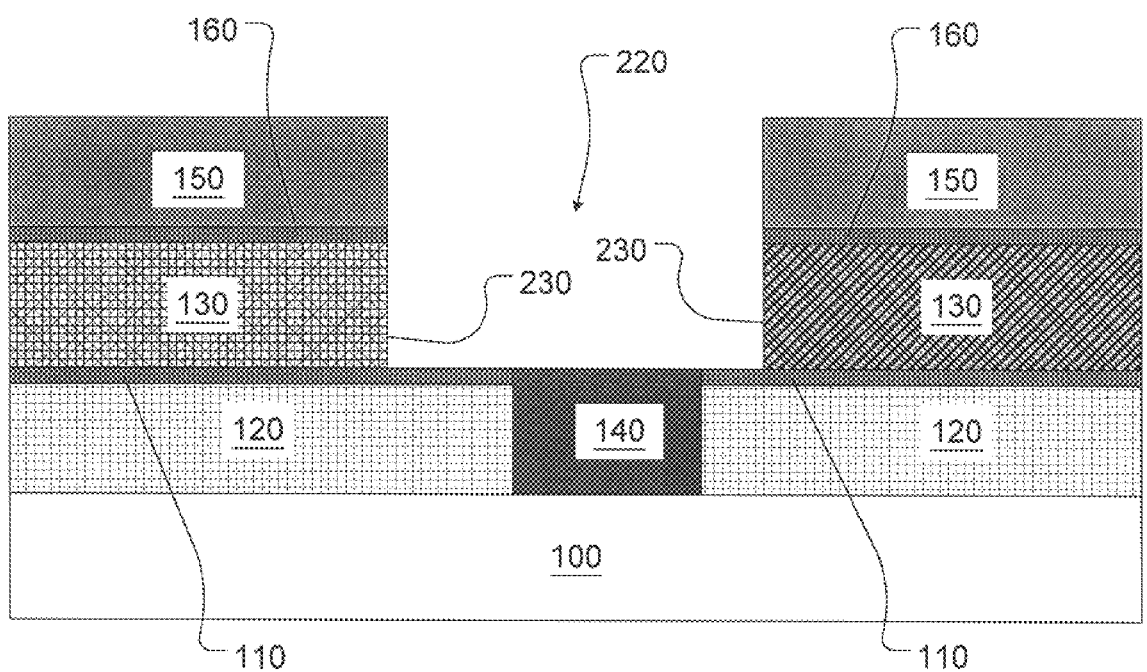

As shown in FIG. 2, a metallization pattern is then formed by using a patterned photomask 150, the etch stop layers 160 and 110 (FIGS. 1–2), and photolithography. For example, openings (such as an opening or trench 220 formed above at least a portion of the first conductive structure 140) for conductive metal lines, contact holes, via holes, and the like, are etched into the second dielectric layer 130 (FIG. 2). The opening 220 has sidewalls 230. The opening 220 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used in various illustrative embodiments. The etching may stop at the etch stop layer 110 and at the first conductive structure 140.

Figure 3:
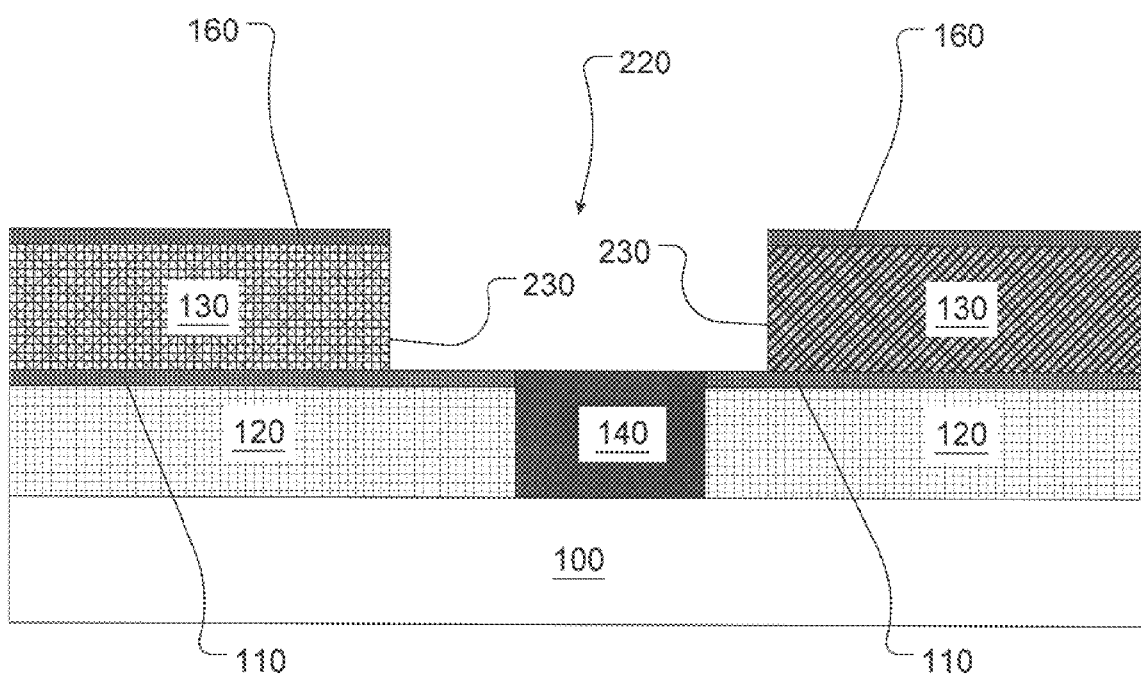

As shown in FIG. 3, the patterned photomask 150 (FIGS. 1–2) is stripped off, by ashing, for example. Alternatively, the patterned photomask 150 may be stripped using a 1:1 solution of sulfuric acid ($H_2SO_4$) to hydrogen peroxide ($H_2O_2$), for example.

Figure 4:
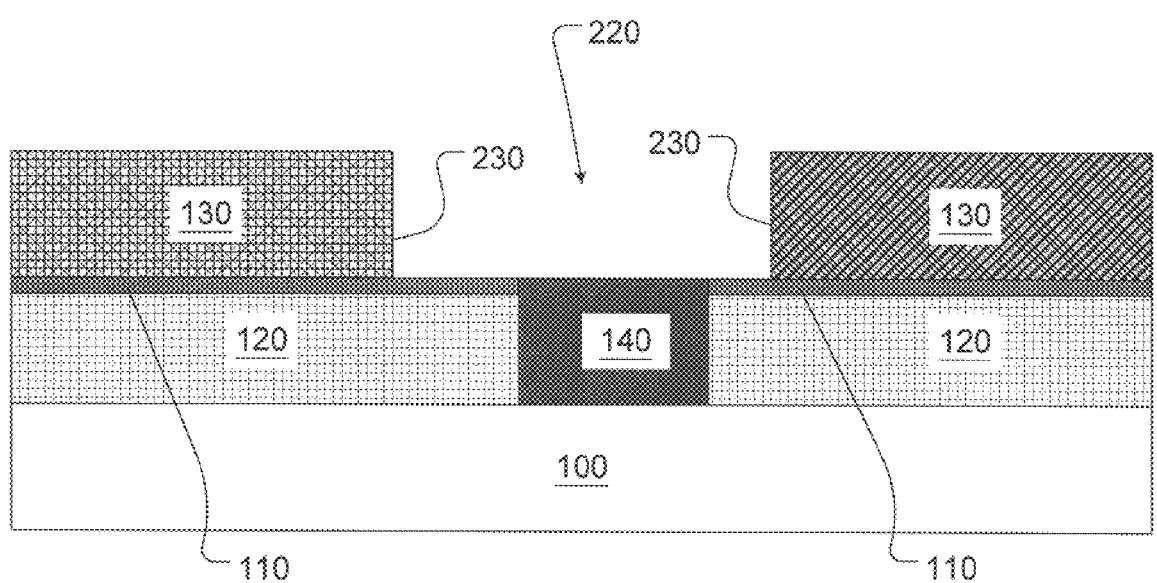

As shown in FIG. 4, the etch stop layer 160 is then stripped off, by selective etching, for example. In various illustrative embodiments, for example, in which the etch stop layer 160 comprises silicon nitride ($Si_3N_4$), hot aqueous phosphoric acid ($H_3PO_4$) may be used to selectively etch the silicon nitride ($Si_3N_4$) etch stop layer 160.

Figure 5:
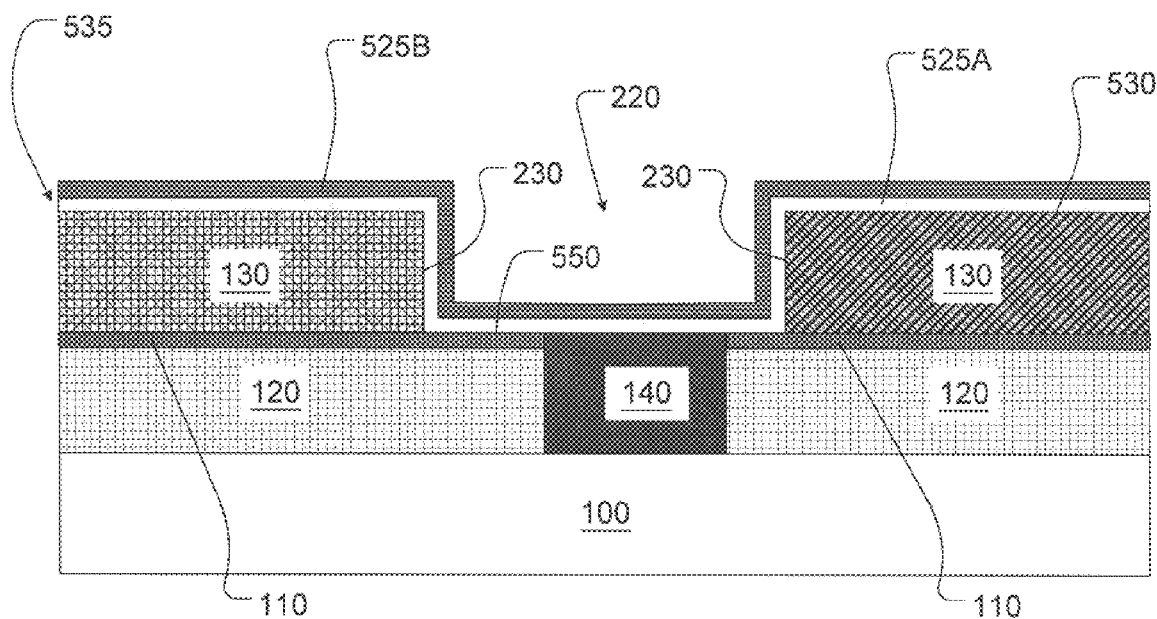

As shown in FIG. 5, a thin barrier metal layer 525A and a copper seed layer 525B (or a seed layer of another conductive material) are applied to the entire surface using vapor-phase deposition. The barrier metal layer 525A and the copper (Cu) seed layer 525B blanket-deposit an entire upper surface 530 of the second dielectric layer 130 as well as the side surfaces 230 and a bottom surface 550 of the opening 220, forming a conductive surface 535, as shown in FIG. 5.

The barrier metal layer 525A may be formed of at least one layer of a barrier metal material, such as tantalum (Ta) or tantalum nitride (TaN), and the like, or, alternatively, the barrier metal layer 525A may be formed of multiple layers of such barrier metal materials. For example, the barrier metal layer 525A may also be formed of titanium nitride (TiN), titanium-tungsten, nitrided titanium-tungsten, magnesium, a sandwich barrier metal Ta/TaN/Ta material, or another suitable barrier material. Tantalum nitride (TaN) is believed to be a good diffusion barrier to copper (Cu). Tantalum (Ta) is believed to be easier to deposit than tantalum nitride (TaN), while tantalum nitride (TaN) is easier to subject to a chemical mechanical polishing (CMP) process than tantalum (Ta). The copper seed layer 525B may be formed on top of the one or more barrier metal layers 525A by physical vapor deposition (PVD) or chemical vapor deposition (CVD), for example.

The bulk of the copper trench-fill is frequently done using an electroplating technique, where the conductive surface 535 is mechanically clamped to an electrode (not shown) to establish an electrical contact, and the structure layer 100 and overlying layers are then immersed in an electrolyte solution containing copper (Cu) ions. An electrical current is then passed through the workpiece-electrolyte system to cause reduction and deposition of copper (Cu) on the conductive surface 535. In addition, an alternating-current bias of the workpiece-electrolyte system has been considered as a method of self-planarizing the deposited copper (Cu) film, similar to the deposit-etch cycling used in high-density plasma (HDP) tetraethyl orthosilicate (TEOS) dielectric depositions.

Figure 6:
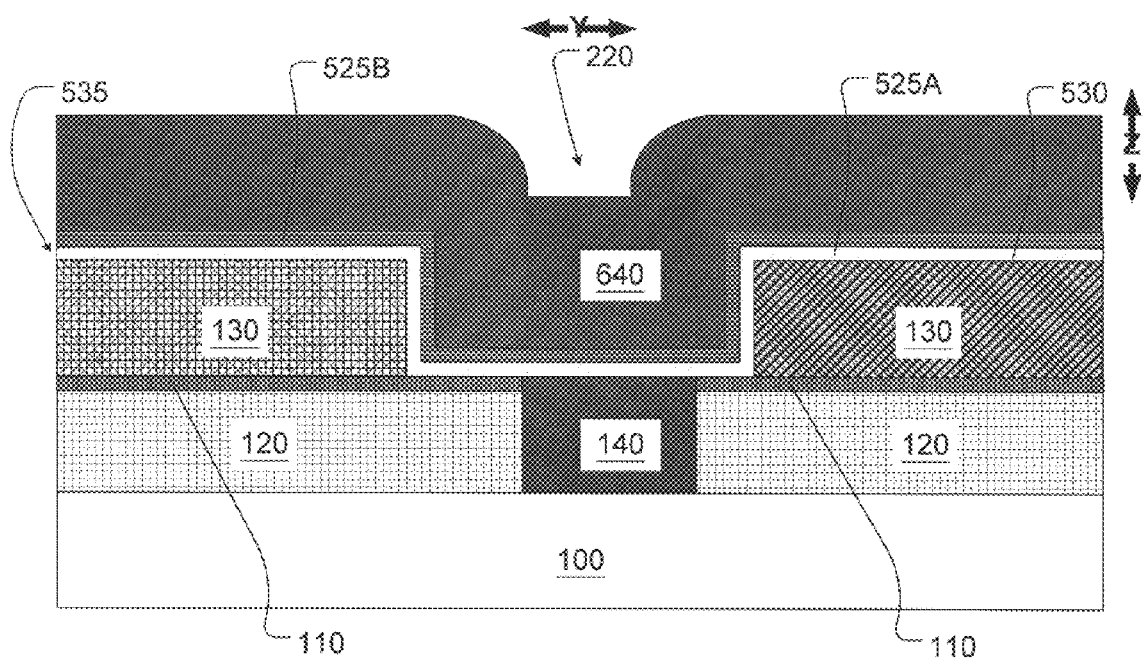

As shown in FIG. 6, this process typically produces a conformal coating of a copper (Cu) layer 640 of substantially constant thickness across the entire conductive surface 535. The copper (Cu) layer 640 may then be annealed using a rapid thermal anneal (RTA) process performed at a temperature ranging from approximately 100–400° C. for a time ranging from approximately 10–180 seconds. Alternatively, the copper (Cu) layer 640 may be annealed using a furnace anneal process at a temperature ranging from approximately 100–400° C. for a time ranging from approximately 10–90 minutes. In various alternative embodiments, the copper (Cu) layer 640 may be annealed using a rapid thermal anneal (RTA) process performed at a temperature ranging from approximately 250–350° C. for a time ranging from approximately 10–180 seconds. In still other various illustrative embodiments, the copper (Cu) layer 640 may be annealed using a furnace anneal process at a temperature ranging from approximately 250–350° C. for a time ranging from approximately 10–90 minutes.

A post-formation anneal may be used to accelerate room-temperature grain growth in the copper (Cu) layer 640, and, consequently, may affect the mechanical stress state of the copper (Cu) layer 640. In particular, the post-formation anneal of over-filled damascene openings, such as opening 220 shown in FIG. 6, affects the mechanical stress state of the copper (Cu) layer 640. For anneals performed at temperatures ranging from about 150–400° C., the copper (Cu) layer 640 is in a relatively low mechanical stress state that is effectively mechanical stress-free, or slightly compressive, since the copper (Cu) has no native oxide strengthening mechanism and since the copper (Cu) grain size is small. The copper (Cu) grain growth in the small-grained copper (Cu) layer 640 under compression will act to relax the mechanical stress. In the copper (Cu) in the opening 220 covered by the sufficiently thick layer of the copper (Cu) layer 640, it is likely that the mechanical stress in the copper (Cu) would be about zero or at least very small at the anneal temperatures ranging from about 150–400° C. The microstructure of the copper (Cu) in the opening 220 is influenced by the sufficiently thick layer of the copper (Cu) layer 640, and it is believed that the mechanical stress in the copper (Cu) in the opening 220 is also influenced by the sufficiently thick layer of the copper (Cu) layer 640.

Upon cooling from the anneal, the mechanical stress in the copper (Cu) in the opening 220 is tensile. Since the copper (Cu) of the copper (Cu) layer 640 has a thickness, measured from the bottom of the opening 220, in a range of approximately 3000 Å–8000 Å, for example, the mechanical stress in the copper (Cu) in the opening 220 is relatively small, with hydrostatic stresses in a range of from about 50 MPa to about 200 MPa.

The mechanical stress in the copper (Cu) in the opening 220 is tensile, after cooling down from the anneal, due in part to the difference in the coefficient of thermal expansion ($\Delta CTE$) between the copper (Cu) in the copper (Cu) layer 640 and the semiconducting material of the structure layer 100. For example, the coefficient of thermal expansion (CTE) for silicon (Si) is about $2.6 \times 10^{-6}/°$ C., the coefficient of thermal expansion (CTE) for copper (Cu) is about $16.6 \times 10^{-6}/°$ C., and the coefficient of thermal expansion (CTE) for aluminum (Al) is about $23.1 \times 10^{-6}/°$ C. Therefore, the difference in the coefficient of thermal expansion ($\Delta CTE$) between copper (Cu) and silicon (Si) is about $14.0 \times 10^{-6}/°$ C. For the sake of comparison, the difference in the coefficient of thermal expansion (ΔCTE) between aluminum (Al) and silicon (Si) is about $20.5 \times 10^{-6}/°$ C., or about 1.46 times larger than the difference in the coefficient of thermal expansion (ΔCTE) between copper (Cu) and silicon (Si). The difference in the coefficient of thermal expansion (ΔCTE) is the dominant source of mechanical strain in a metallic interconnect.

The mechanical stress may be calculated from the mechanical strain using mechanical stiffness coefficients. An order of magnitude estimate of the mechanical stress may be calculated using the biaxial modulus. The biaxial modulus of silicon (Si) is about $1.805 \times 10^5$ MPa (MegaPascals), the biaxial modulus of copper (Cu) is about $2.262 \times 10^5$ MPa, and the biaxial modulus of aluminum (Al) is about $1.143 \times 10^5$ MPa, or about half the biaxial modulus of copper (Cu).

In one illustrative embodiment, copper (Cu) lines having critical dimensions of about 0.25 μm, and a thickness of approximately 4500 Å, similar to the copper (Cu) layer 640, are subjected to a post-plating anneal using a furnace anneal process performed at a temperature of approximately 250° C. for a time of approximately 30 minutes. The mechanical stresses measured along the lengths (X direction, into the page of FIG. 6) of these copper (Cu) lines are about 300 MPa, the mechanical stresses measured along the widths (Y direction, horizontal arrows in FIG. 6) of these copper (Cu) lines are about 160 MPa, and the mechanical stresses measured along the heights (Z direction, horizontal arrows in FIG. 6) of these copper (Cu) lines are about 55 MPa. The hydrostatic mechanical stress measured with these copper (Cu) lines is about 175 MPa.

These mechanical stress levels appear to be a function of the post-plating anneal temperature. By way of comparison, copper (Cu) lines having critical dimensions of about 0.25 μm, and a thickness of approximately 4500 Å, similar to the copper (Cu) layer 640, subjected to a post-plating anneal using a furnace anneal process performed at a higher temperature of approximately 500° C. for the same time of approximately 30 minutes have been measured to have the following mechanical stresses. The mechanical stresses measured along the lengths (X direction) of these copper (Cu) lines are about 600 MPa, the mechanical stresses measured along the widths (Y direction) of these copper (Cu) lines are about 470 MPa, and the mechanical stresses measured along the heights (Z direction) of these copper (Cu) lines are about 230 MPa. The hydrostatic mechanical stress measured with these copper (Cu) lines is about 440 MPa. Since hydrostatic mechanical stress is the driving force for void formation in metallic interconnects, efforts should be made to reduce this hydrostatic mechanical stress. Thus, the post-plating anneal temperature should be lowered to reduce this hydrostatic mechanical stress. For example, a post-plating furnace anneal process performed at approximately 250° C. for approximately 30 minutes, which produces a hydrostatic mechanical stress of about 175 MPa, is preferable to a post-plating furnace anneal process performed at approximately 500° C. for approximately 30 minutes, which produces a hydrostatic mechanical stress of about 440 MPa.

Figure 7:
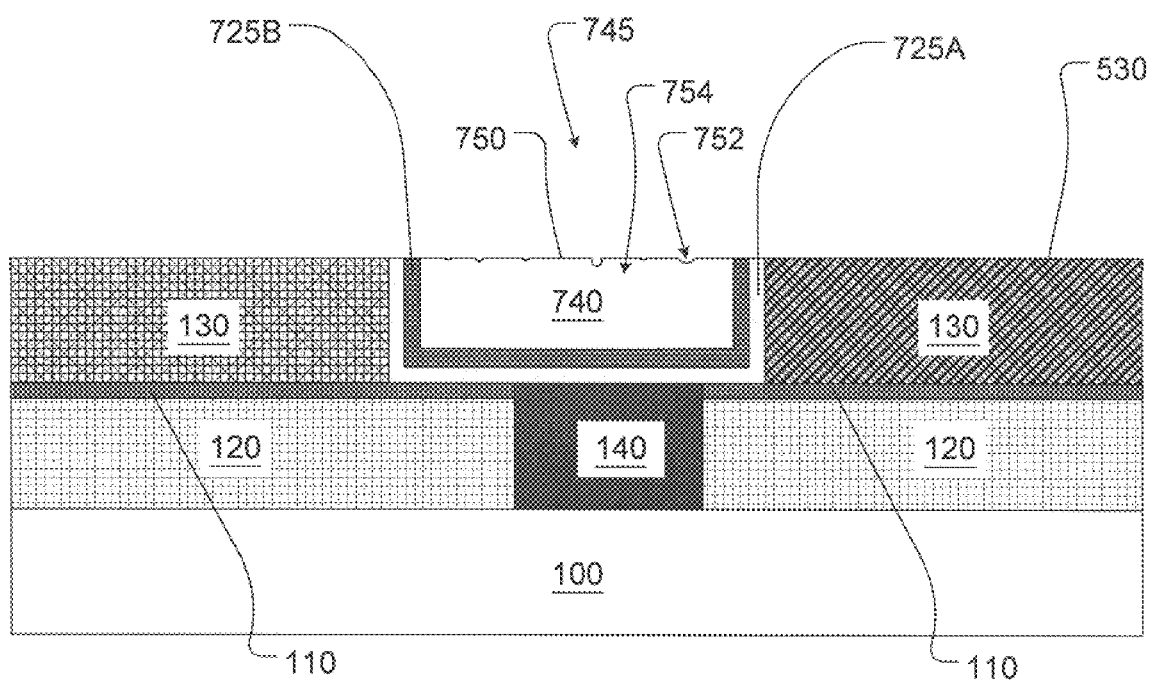

As shown in FIG. 7, following the post-deposition anneal described above, the layer of the copper (Cu) layer 640 is planarized using chemical mechanical polishing (CMP) techniques. The planarization using CMP clears copper (Cu) and barrier metal from the entire upper surface 530 of the second dielectric layer 130, leaving a copper (Cu) portion 740 of the copper (Cu) layer 640 remaining in a metal structure such as a copper (Cu)-filled trench, forming a copper (Cu)-interconnect 745, adjacent remaining portions 725A and 725B of the one or more barrier metal layers 525A and copper seed layer 525B (FIGS. 5 and 6), respectively, as shown in FIG. 7.

Figure 8:
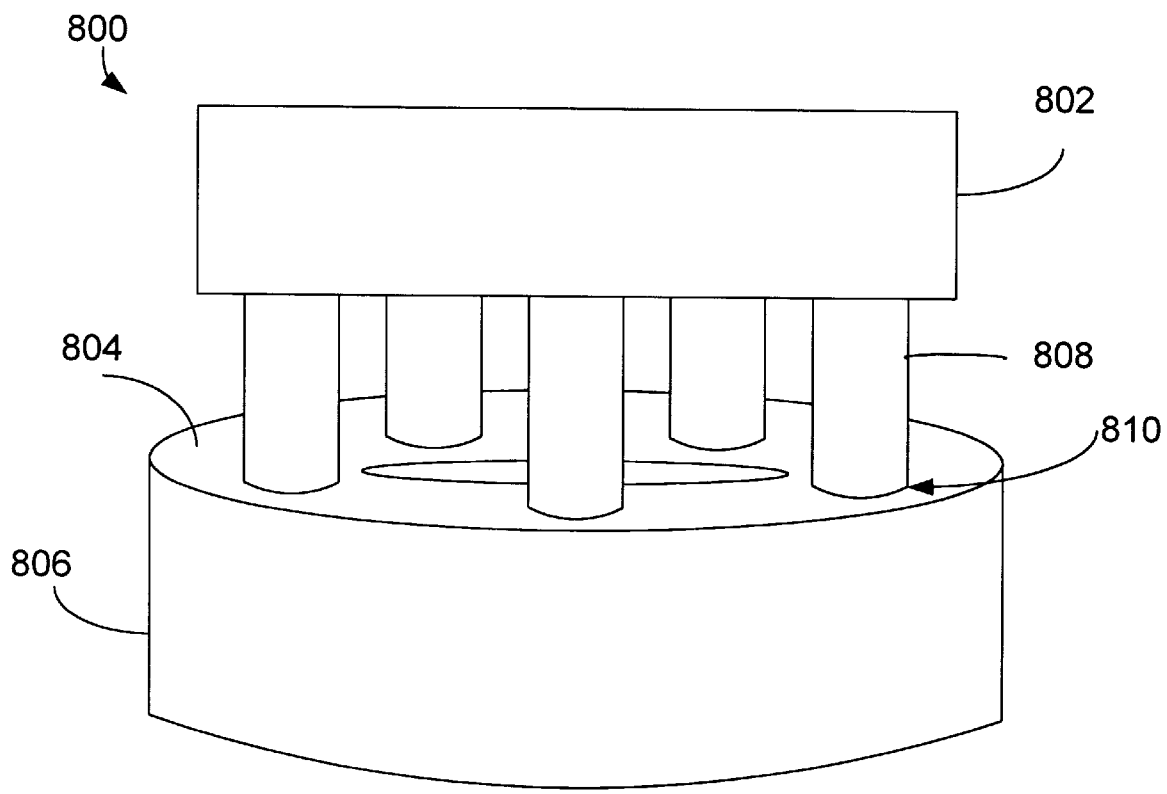
FIG. 8 schematically illustrates a perspective view of a polishing tool.

Referring to FIG. 8, a stylized view of an exemplary multiple arm polishing tool 800 that may be used to perform CMP on the copper layer 640 is shown. The exemplary polishing tool 800 may be comprised of a multi-head carrier 802 positioned above a polishing pad 804 that is mounted on a rotateable platen 806. The multi-head carrier 802 typically includes a plurality of rotateable polishing arms 808, each of which includes a carrier head 810. Wafers (not shown) may be secured to the carrier heads 810 using known techniques, such as vacuum pressure. A source of polishing fluid (not shown) may be provided to supply polishing fluid (e.g., slurry) to the polishing pad 804. Furthermore, although five polishing arms 808 are shown, the polishing tool 800 may be comprised of any number of polishing arms 808. For example, in one embodiment, the polishing tool 800 is comprised of only a single polishing arm 808, and each wafer is polished individually.

Figure 9:
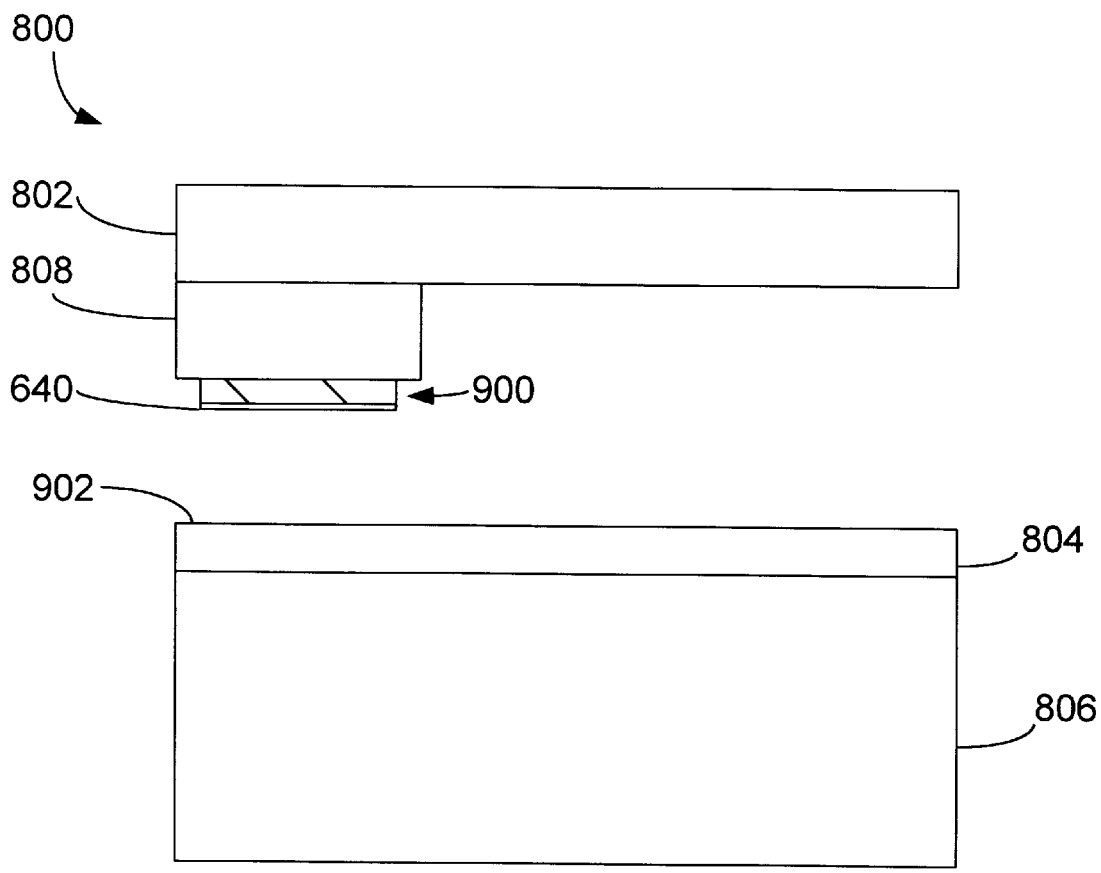
FIG. 9 schematically illustrates a side view of a polishing tool.

Referring to FIG. 9, a simplified and stylized side-view of a portion of the illustrative polishing tool 800 is shown. To simplify illustration of the operation of the polishing tool 800, only one polishing arm 808 is shown. Again, the polishing pad 804 may be fixed to the rotatable platen 806. A wafer 900 of the type shown in FIGS. 1–7 is coupled to the rotatable polishing arm 808, using, for example, vacuum pressure, and the polishing arm 808 may be coupled to the carrier 802. To effectuate polishing, the polishing arm 808 may be extended such that the copper layer 640 of the wafer 900 is pressed against a polishing surface 902 of the polishing pad 804. Furthermore, the platen 806 may be rotated, typically at a constant speed. Moreover, a variable downward force may be applied to the polishing arm 808, and the polishing arm 808 may be rotated and oscillated back and forth across the polishing pad 804.

Figure 10:
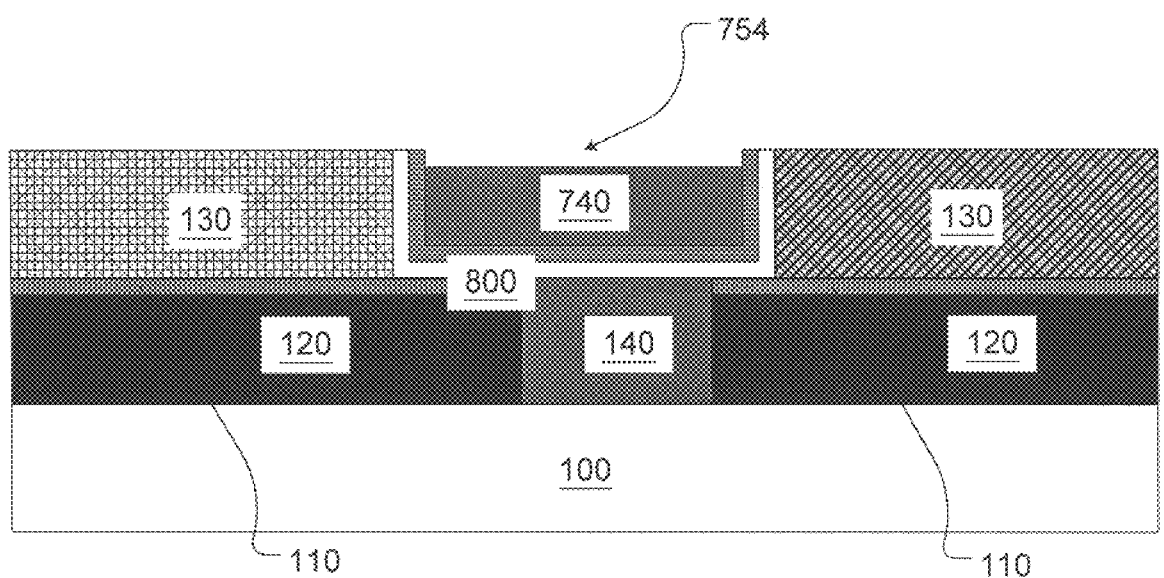

As discussed above, the planarazation process may leave the copper portion 740 with a roughened surface 750 or with contamination thereon, as shown in FIG. 7. The roughened surface 750 may have a plurality of scratches or grooves 752 formed therein as a result of the slurry particles, foreign materials, or the like. An upper region 754 of the copper portion 740, which includes the roughened surface 750, may be removed. For example, as shown in FIG. 10, the upper region 754 may be removed by a chemical process, such as by applying a selective etchant onto at least the roughened surface 750. In one embodiment, an etchant solution of Ammonium Persulfate is applied to the surface 750 of the copper portion 740 for a period of time in the range of about 1–5 minutes at about room temperature. In the embodiment illustrated in FIG. 10, the depth of the upper region 754 removed from the copper portion 740 should be sufficient to remove the roughened surface 750 and/or any contaminants contained therein. In one embodiment, the depth of the upper region 754 removed from the copper portion 740 is in the range of about 200–1000 Å. However, depending upon the level of the scratches and contaminants, more or less of the upper region 754 may be removed by the etching process.

Figure 11:
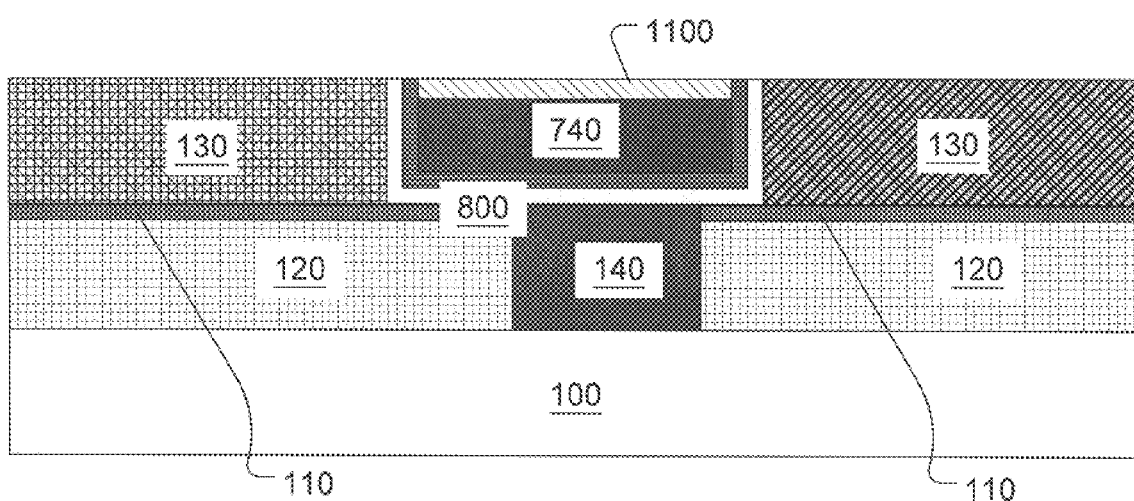

Thereafter, as shown in FIG. 11, the upper region 754, which has been removed, is now replaced by depositing a copper layer 1100 above the copper portion 740, substantially replacing the upper region 754. In one embodiment, a selective process is used to place the copper layer 1100 only on the copper portion 740, and not on the dielectric layer 130. In one embodiment, the selective process may be an electroless copper deposition process.

Figure 12:
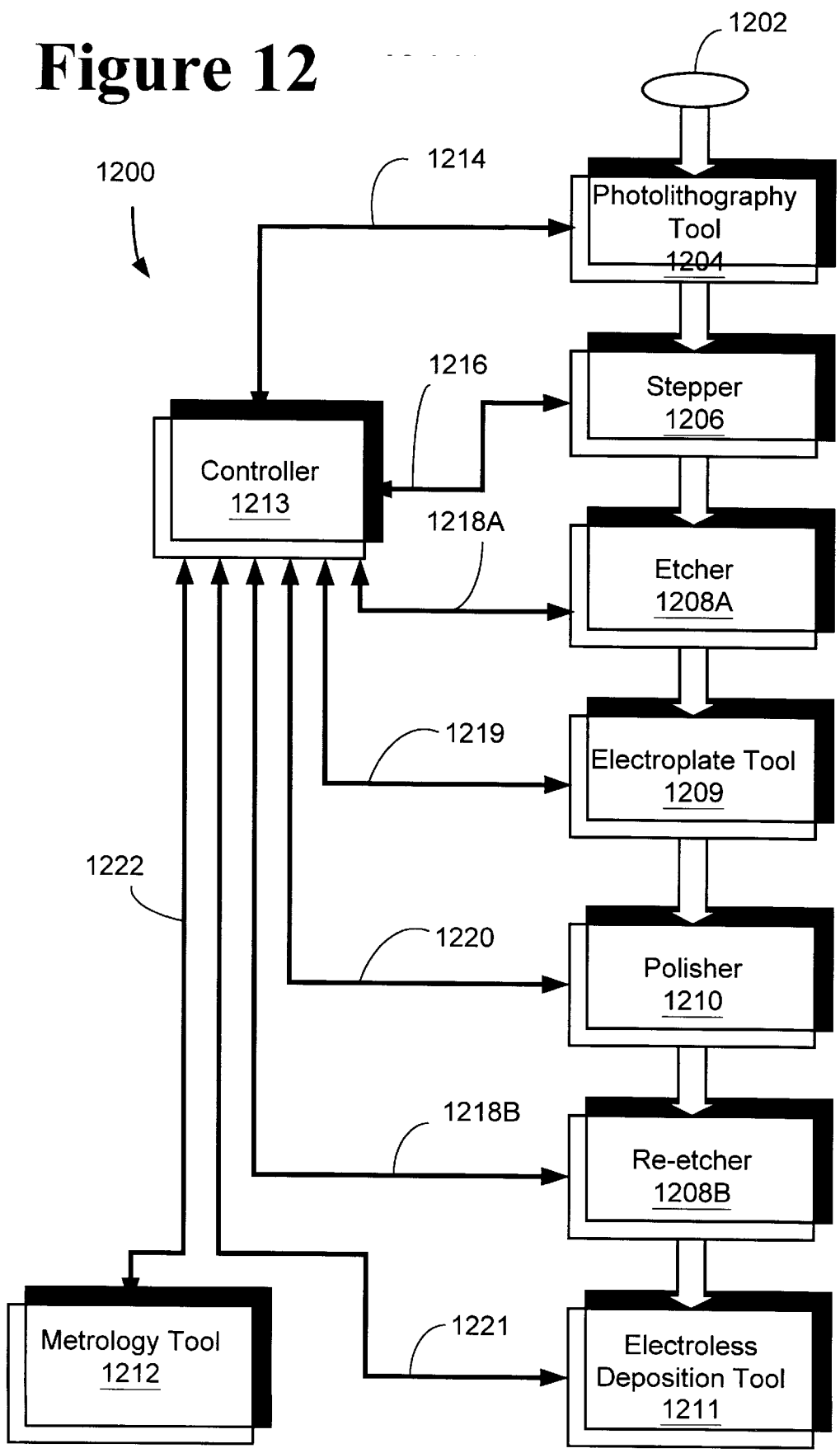
FIG. 12 schematically illustrates one embodiment of a control system useful in manufacturing semiconductor devices having features of the type illustrated in FIGS. 1–7, 10, and 11.

Turning now to FIG. 12, one illustrative embodiment of a system 1200 that may be used to produce the features of the semiconductor device depicted in FIGS. 1–7, 10, and 11 is shown. The system 1200 processes wafers 1202 and is generally comprised of a photolithography tool 1204, a stepper 1206, an etcher 1208A, an electroplate tool 1209, a polisher 1210, a re-etcher 1208B, an electroless deposition tool 121 1, a metrology tool 1212, and a controller 1213. The wafer 1202 is generally serially processed within each of the tools 1204–1211, and then analyzed in the metrology tool 1212. Those skilled in the art will appreciate that more or fewer tools may be included in the system 1200 as is warranted to produce the desired features on the wafer 1202.

Generally, the photolithography tool 1204 forms a layer of photoresist on the wafer 1202. The stepper 1206 controllably exposes the layer of photoresist to a light source through a mask or reticle to produce a desired pattern in the layer of photoresist. The etcher 1208A removes those portions of layers underlying the layer of photoresist that are exposed by the patterning produced by the mask to produce openings and/or holes in a desired pattern. The electroplate tool 1209 forms a layer or film of copper on the surface of the wafer 1202, filling the openings and/or holes. The polisher 1210 removes the copper layer with the exception of the portion of the copper layer within the openings and/or holes. The etcher 1208A may be employed again to selectively remove the top, roughened or contaminated portion of the remaining copper layer, or alternatively, a second etcher or re-etcher 1208B may be used. Thereafter, the electroless deposition tool 1211 selectively forms a layer of copper on top of the etched copper layer to effectively replace the damaged or contaminated surface of the copper.

The metrology tool 1212 may be used at various stages of the process to measure select parameters of the wafer 1202, such as physical characteristics and/or electrical properties. The measured physical characteristics may include thickness of the copper layer, feature sizes, depth of an etching process, etc. The measured electrical properties may include resistance, conductivity, voltage levels, etc. In some embodiments, the metrology tool 1212 may not be needed, as sufficient feedback information for controlling parameters of the tools 1204–1211 may be obtained from sensors within the tools 1204–1211.

The metrology tool 1212 may be any of a variety of devices used to measure electrical and/or structural features on the wafer 1202 after being processed by the tools 1204–1211. For example, the metrology tool 1212 may be configured to measure feature sizes on the wafer 1202, such as the thickness of the copper layer 1100, and provide the measurement data to the controller 1213. Measurements of this type may be useful in determining whether the re-etcher 1208B and the electroless deposition process have produced a layer of copper 1100 having a desired thickness, and then modifying the operation of the electroless deposition tool 1211 or re-etcher 1208B, if necessary, so that subsequently processed wafers 1202 have the desired thickness. Such a metrology tool is available from Rudolph Technologies under the model designation MetaPulse. It is contemplated that in some embodiments of the instant invention additional tools (not shown) may be deployed in the manufacturing line, such as additional metrology tools 1212 positioned to measure certain mechanical or electrical parameters of the wafer 1202 at various steps in the manufacturing process. Alternatively, additional tools may be deployed, such as, intermediate the etcher 1208A and the electroplate tool 1209. These intermediate devices may perform additional processes, such as cleaning, rinsing, forming additional layers, etc. Moreover, it is anticipated that the formation of some of the features on the wafer 1202 will be produced by operations performed by the tools 1204–1211 other than in the order illustrated.

The etchers 1208A and 1208B may be any of a variety of devices capable of selective etching the copper layer remaining in the openings and/or holes. For example, a spray acid etcher commercially available from Semitool as the Magnum model may be used. Other etchers, such as wet benches may also be used. Any of a variety of etchants may be employed without departing from the spirit and scope of the instant invention. In one exemplary embodiment, the etcher 1208 employs plasma etching.

The controller 1213 of FIG. 12 may take a variety of forms. For example, the controller 1213 may be included within the tools 1204–1211, or it may be a separate device electrically coupled to the tools 1204–1211 via lines 1214–1222, respectively. In the embodiment illustrated herein, the controller 1212 takes the form of a computer that is controlled by a variety of software programs. Those of ordinary skill in the art having the benefit of this disclosure will appreciate that the controller 1213 need not rely on software for its functionality, but rather, a hardware controller may be used to provide the functionality described herein and attributed to the controller 1213. Further, the controller 1213 need not be coupled only to the tools 1204–1211, but rather, could be coupled to and involved in controlling or collecting data from other devices involved in the manufacture of semiconductor devices.

In the illustrated embodiment, the automatic process controller 1213 is a computer programmed with software to implement the functions described. However, as will be appreciated by those of ordinary skill in the art, a hardware controller (not shown) designed to implement the particular functions may also be used. Moreover, the functions of the controller described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 1012, as described, is the KLA Tencor Catalyst system offered by KLA Tencor, Inc. The KLA Tencor Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 13:
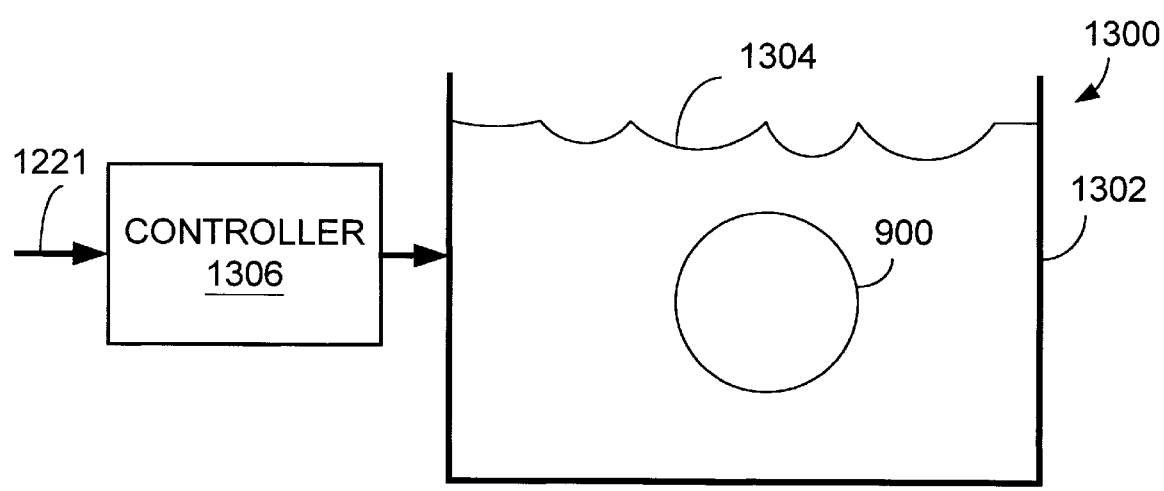
FIG. 13 schematically illustrates one embodiment of a semiconductor manufacturing tool useful in forming a layer or film of copper.

Turning now to FIG. 13, a stylized representation of an electroless deposition tool 1300 is shown. Generally, the electroless copper deposition tool 1300 includes a tank 1302 containing a chemical reduction bath 1304. The electroless copper deposition process involves placing the wafer 900 in the chemical reduction bath 1304 generally composed of a Cu source, a reducing agent, such as formaldehyde, and an electrolyte, such as citrates or Ethylenediaminetetraacetic (EDTA). Thus, copper atoms are transported from the chemical reduction bath 1304 to the surface of the copper layer 740. The process continues for a preselected period of time to produce a conformal layer or film of copper 1000 on top of the layer 740. To produce a copper layer 1100 of sufficient thickness to essentially replace the upper region 754, the wafer 900 may be placed in the chemical reduction bath for a period of time in the range of about 1–5 minutes, depending on the temperature, which may be at about room temperature ±10° F. A controller 1306 operates to vary the time that the wafer 900 is held in the bath. As those skilled in the art will appreciate, the controller 1306 may also operate to control other parameters of the electroless copper deposition process to control the thickness of the copper layer 110 to substantially replace the previously removed upper region 754.

The electroless deposition tool 1300 may be any of a variety of devices capable of depositing the layer of copper 1100 on the copper portion 740. For example, an electroless deposition tool commercially available from Technics as the Semcor 3000 model may be used.

The thickness of the copper layer 1100 may be controlled by altering a variety of parameters. First, the duration that the wafer 900 remains in the bath 1304 will directly impact the thickness of the copper layer 1100. That is, reducing the period of time will reduce the thickness of the copper layer 1100, and increasing the period of time will increase the thickness of the copper layer 1100. The rate at which the thickness of the copper layer 1100 increases may not be constant, but rather, may vary over time, depending upon the condition and temperature of the bath 1304. Moreover, the type of features present on the wafer 900 may also impact the rate. For example, increasing the number of features may produce a greater surface area, which may impact the rate at which the thickness of the copper layer 1100 increases.

Varying the temperature or composition of the chemical reduction bath 1304 may also impact the rate at which the thickness of the copper layer 1100 increases. For example, increasing the temperature of the bath 1304 may raise the rate at which copper is deposited on the wafer 900. Conversely, lowering the temperature of the bath 1304 may reduce the rate at which copper is deposited on the wafer 900.

The present invention may be employed on a lot-by-lot basis and/or on a wafer-b-wafer basis. In general, the more frequent the measurements, the more uniform and accurate will be the electroless deposition process performed by the electroless deposition tool 1300. That is, the thickness of the copper layers 740, 1100 need not be measured on each wafer 900, but rather, a previous measurement may be used by the controller 1213 to control the parameters of the electroless deposition tool 1300 and/or the electroplate tool 1209 to produce the desired thickness of the copper layers 1100, 740. The number of wafers processed between measurements is a matter of design discretion, which depends substantially on the details of the particular embodiment.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below. Accordingly, the protection sought herein is as set forth in the claims below.

What is claimed:

1. A method, comprising:

forming a first dielectric layer above a first structure layer;

forming a first opening in the first dielectric layer;

forming a first copper layer above the first dielectric layer and in the first opening using electrochemical deposition of copper, and forming at least one barrier layer and a copper seed layer in the first opening before the electrochemical deposition of the copper;

removing a portion of the first copper layer outside of said opening;

removing a surface portion of the first copper layer within the opening; and forming a second layer of copper above said first layer of copper, replacing the removed surface portion.

2. The method of claim 1, wherein forming the first dielectric layer comprises forming the first dielectric layer using at least one of a chemical vapor deposition (CVD) is process, a low-pressure CVD (LPCVD) process, a plasma-enhanced CVD (PECVD) process, a sputtering process, a physical vapor deposition (PVD) process, and a spin-on coating process.

3. The method of claim 1, wherein forming the first opening in the first dielectric layer comprises forming the first opening in the first dielectric layer using one of a mask of photoresist and an etch stop layer, the one of the mask of photoresist and the etch stop layer being formed and patterned above the first dielectric layer.

4. The method of claim 3, wherein using the one of the mask of photoresist and the etch stop layer comprises using the etch stop layer being formed of silicon nitride.

5. The method of claim 1, wherein forming the first copper layer further comprises electroplating the first copper layer above the first dielectric layer and in the first opening.

6. The method of claim 1, wherein removing the portion of the first copper layer outside of said opening further comprises polishing the first copper layer.

7. The method of claim 1, wherein removing the portion of the first copper layer outside of said opening further comprises chemical mechanical polishing the first copper layer.

8. The method of claim 1, wherein removing the surface portion of the first copper layer within the opening further comprises etching the surface portion of the first copper layer.

9. The method of claim 8, wherein etching the surface portion of the first, copper layer further comprises applying a selective etchant to the surface portion of the first copper layer.

10. The method of claim 9, wherein applying a selective etchant to the surface portion of the first copper layer further comprises applying a solution of ammonium persulfate to the surface portion of the first copper layer.

11. The method of claim 10, wherein applying a solution of ammonium persulfate to the surface portion of the first copper layer further comprises applying a solution of ammonium persulfate to the surface portion of the first copper layer for a period of time in the range of about 1–5 minutes.

12. The method of claim 1, wherein removing the surface portion of the first copper layer within the opening further comprises removing the surface portion of the first copper layer within the opening to a depth in the range of about 200–1000 Å.

13. The method of claim 1, wherein forming the second layer of copper above said first layer of copper, replacing the removed surface portion further comprises selectively depositing the second layer of copper above said first layer of copper, replacing the removed surface portion.

14. The method of claim 13, wherein selectively depositing the second layer of copper above said first layer of copper, replacing the removed surface portion further comprises using an electroless deposition process to selectively deposit the second layer of copper above said first layer of copper, replacing the removed surface portion.

* * * * *